United States Patent
Hong et al.

(10) Patent No.: US 8,816,509 B2
(45) Date of Patent: Aug. 26, 2014

(54) SEMICONDUCTOR PACKAGE INCLUDING UNDERFILL LAYERS

(71) Applicant: Samsung Electronics Co., Ltd., Suwon-si (KR)

(72) Inventors: Ji-Seok Hong, Yongin-si (KR); Kwang-chul Choi, Suwon-si (KR); Sangwon Kim, Seoul (KR); Hyun-Jung Song, Hwaseong-si (KR); Eun-Kyoung Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/733,481

(22) Filed: Jan. 3, 2013

(65) Prior Publication Data

US 2013/0193588 A1    Aug. 1, 2013

(30) Foreign Application Priority Data

Jan. 27, 2012  (KR) .......................... 10-2012-0008381

(51) Int. Cl.
| | | |
|---|---|---|
| *H01L 23/48* | (2006.01) | |
| *H01L 23/52* | (2006.01) | |
| *H01L 29/40* | (2006.01) | |
| *H01L 23/02* | (2006.01) | |
| *H01L 23/00* | (2006.01) | |
| *H01L 21/56* | (2006.01) | |
| *H01L 23/29* | (2006.01) | |
| *H01L 25/065* | (2006.01) | |
| *H01L 25/00* | (2006.01) | |
| *H01L 23/31* | (2006.01) | |

(52) U.S. Cl.
CPC ....... *H01L 23/29* (2013.01); *H01L 2224/16146* (2013.01); *H01L 2224/94* (2013.01); *H01L 2224/73104* (2013.01); *H01L 24/33* (2013.01); *H01L 2224/81191* (2013.01); *H01L 2225/06513* (2013.01); *H01L 2224/81201* (2013.01); *H01L 21/563* (2013.01); *H01L 2225/06541* (2013.01); *H01L 2224/29036* (2013.01); *H01L 2224/33051* (2013.01); *H01L 2224/83986* (2013.01); *H01L 23/3114* (2013.01); *H01L 2224/293* (2013.01); *H01L 21/561* (2013.01); *H01L 25/0657* (2013.01); *H01L 2224/131* (2013.01); *H01L 2224/97* (2013.01); *H01L 2224/2929* (2013.01); *H01L 2224/83104* (2013.01); *H01L 2224/9211* (2013.01); *H01L 2224/83191* (2013.01); *H01L 24/29* (2013.01); *H01L 2224/29099* (2013.01); *H01L 24/32* (2013.01); *H01L 24/94* (2013.01); *H01L 24/16* (2013.01); *H01L 2224/84201* (2013.01); *H01L 24/81* (2013.01); *H01L 24/83* (2013.01); *H01L 25/50* (2013.01)
USPC ............ 257/778; 257/686; 257/777; 257/783

(58) Field of Classification Search
USPC ......... 257/777, 686, 787, 790, 774, 778, 782, 257/783, 786
See application file for complete search history.

(56) References Cited

U.S. PATENT DOCUMENTS

| | | | |
|---|---|---|---|
| 6,867,502 B2 * | 3/2005 | Katagiri et al. ............... | 257/778 |
| 7,151,009 B2 | 12/2006 | Kim et al. | |

(Continued)

FOREIGN PATENT DOCUMENTS

| | | |
|---|---|---|
| JP | 2006229163 | 8/2006 |
| JP | 2008263005 | 10/2008 |

(Continued)

*Primary Examiner* — Matthew Reames
*Assistant Examiner* — Dilinh Nguyen
(74) *Attorney, Agent, or Firm* — Onello & Mello, LLP

(57) ABSTRACT

A semiconductor package includes first and second semiconductor elements electrically interconnected by a connection structure. The first and second semiconductor elements are joined by a protection structure that includes an adhesive layer surrounded by a retention layer.

9 Claims, 12 Drawing Sheets

(56) References Cited

U.S. PATENT DOCUMENTS

| | | | |
|---|---|---|---|
| 7,199,479 B2 * | 4/2007 | Wu | 257/787 |
| 8,426,246 B2 * | 4/2013 | Toh et al. | 438/108 |
| 2007/0178627 A1 * | 8/2007 | Jiang et al. | 438/108 |
| 2010/0244233 A1 | 9/2010 | Kim et al. | |
| 2011/0151563 A1 | 6/2011 | Paukshto et al. | |
| 2012/0144148 A1 * | 6/2012 | Seo et al. | 711/170 |

FOREIGN PATENT DOCUMENTS

| | | |
|---|---|---|
| KR | 1020000043560 | 7/2000 |
| KR | 1020050104164 | 11/2005 |
| KR | 1020090098067 | 9/2009 |

* cited by examiner

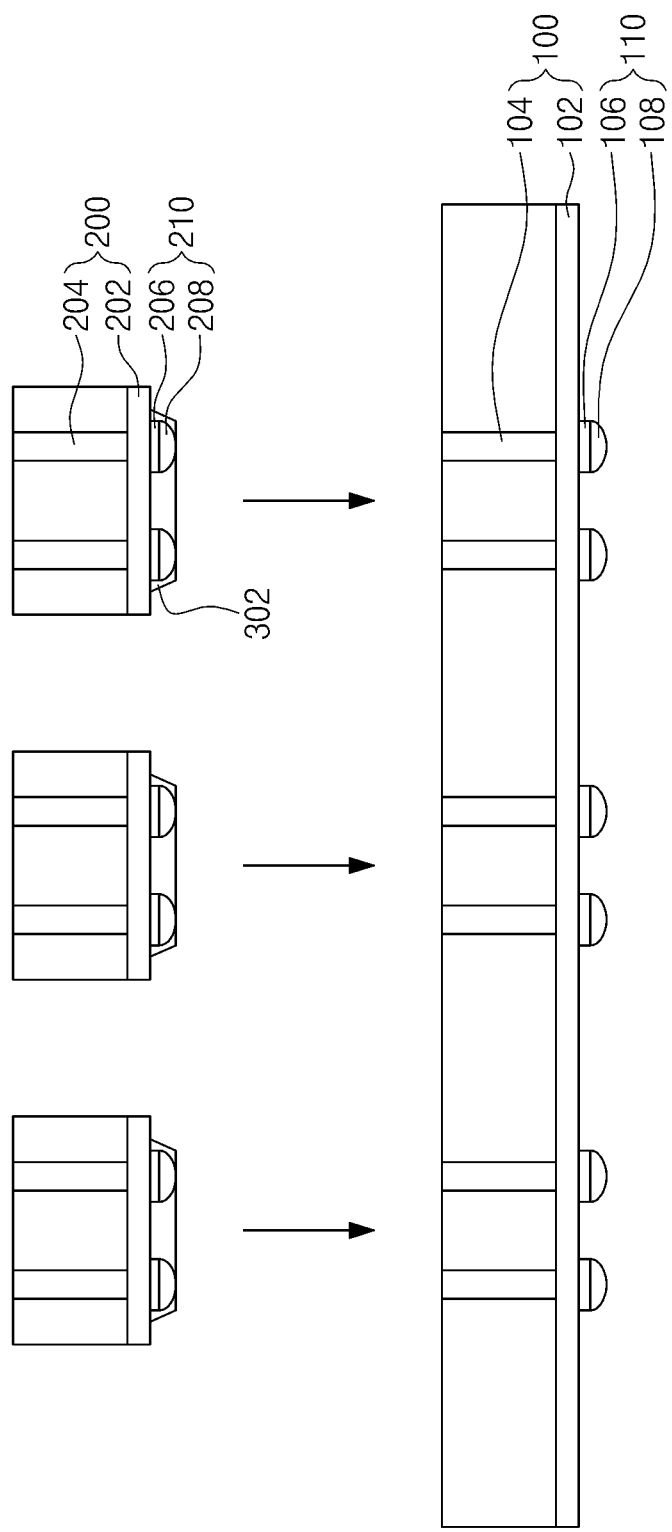

SEMICONDUCTOR PACKAGE INCLUDING UNDERFILL LAYERS

CROSS-REFERENCE TO RELATED APPLICATIONS

This U.S. non-provisional patent application claims priority under 35 USC §119 to Korean Patent Application No. 10-2012-0008381, filed on Jan. 27, 2012, the entirety of which is hereby incorporated by reference.

BACKGROUND OF THE INVENTION

Inventive concepts relate to semiconductor packages and, more particularly, to a semiconductor package with a vertical multi-stacked structure.

With the recent trend toward miniaturization and multi-functionality in electronic products, semiconductor chips may be vertically stacked in a semiconductor package in order to increase the density of electronics within a product. In such a stack of semiconductor chips the chips may be electrically connected by a connection member, such as a solder ball, and bonded to one another with an adhesive provided therebetween. Such bonding may reduce the reliability of the vertically stacked semiconductor package.

SUMMARY OF THE INVENTION

Embodiments of the inventive concept provide a semiconductor package.

In accordance with principles of inventive concepts, a plurality of semiconductor elements, each of which may include a semiconductor chip and a substrate, may be vertically stacked to form a vertically stacked semiconductor package that provides a high level of functional density. Connection structures may be formed between any pairs of semiconductor elements in the stack of semiconductor elements. A connection structure may occupy a region AR that does not extend to the edges of the semiconductor elements. That is, a perimeter area of each of the joined semiconductor elements may surround the connection structure regions AR. The connection structure may include connection pads and solder balls, for example. A protection structure, including first and second material layers, may be formed between the first and second joined semiconductor elements. A first material layer may encompass the connection structure and may be adjacent to and in contact with the connection structure. The first material layer, which may include an adhesive film, may adhere to and join a plurality of semiconductor elements, for example, surrounding a connection structure that electrically interconnects the semiconductor chips and circuitry contained therein. The first material layer may be a mechanical bonding layer. The first material layer may extend to, but not penetrate, a perimeter that surrounds the connection region AR. The second material layer, which may include insulating material, may retain the first material layer in a position between the joined semiconductor chips, and may prevent it from flowing beyond the edges of the joined semiconductor elements, particularly during a manufacturing process during which pressure may be applied to the semiconductor elements. In exemplary embodiments in accordance with principles of inventive concepts, the first layer does not extend to the edges of the joined semiconductor elements and the second layer surrounds the first layer, extending from chip-to-chip and retaining the first layer therebetween. The first and second layers may have sloped mating walls, for example. In this manner, the first material layer can be prevented from extruding to side surfaces of semiconductor elements and, during subsequent formation of a molding structure, a void can thereby be prevented from being formed in the molding structure by an extruding first material layer. That is, in accordance with principles of inventive concepts, the second material layer may operate as a retention barrier for the first material layer. By such avoidance or elimination of a void, the reliability of a semiconductor package can be enhanced.

According to an aspect inventive concepts, a semiconductor package may include a first semiconductor element, which may include a semiconductor chip and a substrate, for example, a second semiconductor element, which may include a second semiconductor chip and second substrate, for example oppositely, or opposingly, spaced apart from the first semiconductor element, connection structures disposed to electrically connect the first and second semiconductor elements to each other, and a protective structure disposed to protect the connection structures and bond the first and second semiconductor elements to each other. The protective structure includes a first material layer disposed to fully cover the connection structures, when viewed from the top, and a second material layer disposed to surround the first material layer.

In exemplary embodiments in accordance with principles of inventive concepts, connection structures may be collectively disposed on one region of one surface of the second semiconductor element and a first material layer has the substantially same or larger area as the one region of the second semiconductor element.

In exemplary embodiments in accordance with principles of inventive concepts, a second material layer may cover a region of the one surface of the second semiconductor element where the first material layer is not disposed.

In exemplary embodiments in accordance with principles of inventive concepts, the first material layer may fully fill a space between adjacent connection structures, when viewed cross-sectionally, extends to the outside of the adjacent connection structures, and has a sloped mating surface with the second material layer.

In exemplary embodiments in accordance with principles of inventive concepts, the first material layer may include an adhesive film.

In exemplary embodiments in accordance with principles of inventive concepts, a side surface of the second material layer is the same plane as the side surfaces of the first and second semiconductor elements.

In exemplary embodiments in accordance with principles of inventive concepts, the second material layer is not in contact with the connection structure and the second material layer may include an underfill material or a molding material.

In exemplary embodiments in accordance with principles of inventive concepts, each of the first and second semiconductor elements includes penetration electrodes penetrating the first and second semiconductor elements.

In exemplary embodiments in accordance with principles of inventive concepts, a semiconductor package may include a first semiconductor element; a second semiconductor element opposingly spaced apart from the first semiconductor element; an adhesive film disposed between the first and second semiconductor elements to bond the first and second semiconductor elements to each other; an insulating structure disposed to fill a space between the first and second semiconductor elements where the adhesive film is disposed outside a region where the adhesive film is disposed; and connection structures disposed in the adhesive film to electrically connect the first and second semiconductor elements to each other.

In exemplary embodiments in accordance with principles of inventive concepts, one surface of the second semiconductor element includes a region in which the connection structures are disposed, and the adhesive film is disposed in that region.

In exemplary embodiments in accordance with principles of inventive concepts, the insulating structure is not contact with the connection structures.

In exemplary embodiments in accordance with principles of inventive concepts, the adhesive film fully fills a space between adjacent connection structures, when viewed cross-sectionally, extends to the outside of the adjacent connection structures, and has a sloped mating surface with the insulating structure.

In exemplary embodiments in accordance with principles of inventive concepts, a side surface of the insulating structure is the substantially same plane as the side surfaces of the first and second semiconductor elements.

In exemplary embodiments in accordance with principles of inventive concepts, a semiconductor package includes a first semiconductor element; a second semiconductor element; a connection structure electrically interconnecting the first and second semiconductor elements; and a protection structure including a mechanical bonding layer and a retention layer formed between the first and second semiconductor elements.

In exemplary embodiments in accordance with principles of inventive concepts, the protection structure includes an adhesive layer that surrounds and is in contact with the connection structure and is in contact with the first and second elements, and the retention layer includes an insulation layer disposed on the perimeter of the adhesive layer but not extending beyond the edges of the first and second semiconductor elements.

In exemplary embodiments in accordance with principles of inventive concepts, the adhesive layer includes epoxy and silicon filler.

In exemplary embodiments in accordance with principles of inventive concepts, the semiconductor elements include memory chips and the package is employed in a memory system.

In exemplary embodiments in accordance with principles of inventive concepts, cellular telephone includes a semiconductor package in accordance with principles of inventive concepts.

BRIEF DESCRIPTION OF THE DRAWINGS

Exemplary embodiments of the inventive concept will be more clearly understood from the following detailed description taken in conjunction with the accompanying drawings in which:

FIGS. 5A through 5E are cross-sectional views illustrating an exemplary embodiment of a method for manufacturing a semiconductor packages in accordance with principles of inventive concepts

DETAILED DESCRIPTION

Figure 1:
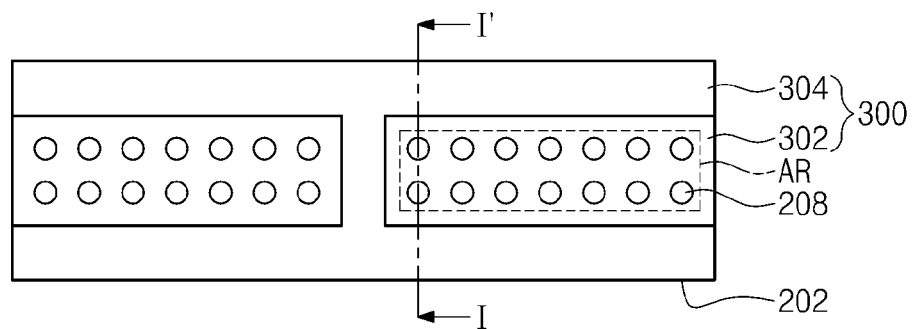
FIG. 1 is a top plan view of an exemplary embodiment of a semiconductor package in accordance with principles of inventive concepts.

Exemplary embodiments in accordance with principles of inventive concepts will now be described more fully with reference to the accompanying drawings, in which exemplary embodiments are shown. Exemplary embodiments in accordance with principles of inventive concepts may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions may be exaggerated for clarity. Like reference numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (for example, "between" versus "directly between," "adjacent" versus "directly adjacent," "on" versus "directly on"). The word "or" is used in an inclusive sense, unless otherwise indicated.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "bottom," "below," "lower," or "beneath" other elements or features would then be oriented "atop," or "above," the other elements or features. Thus, the exemplary terms "bottom," or "below" can encompass both an orientation of above and below, top and bottom. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which exemplary embodiments in accordance with principles of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. Although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

Figure 2:
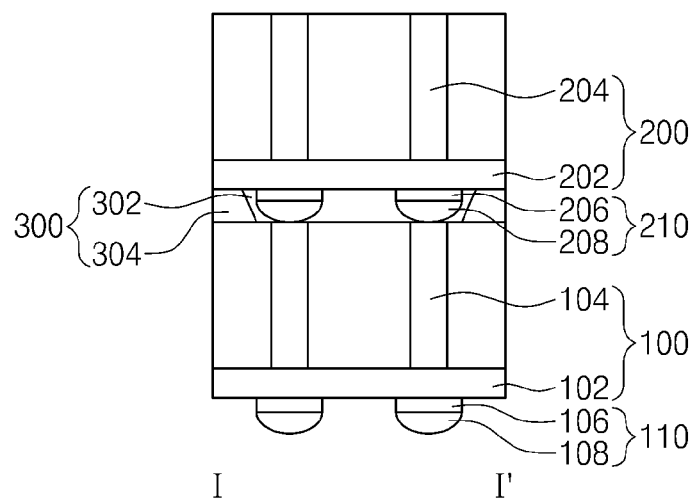
FIGS. 2 through 4 are cross-sectional views of an exemplary embodiment of semiconductor packages in accordance with principles of inventive concepts.
Figure 3:
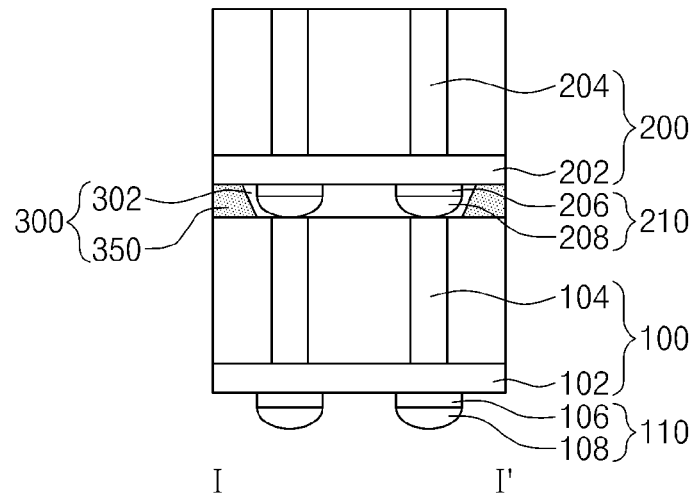
Figure 4:
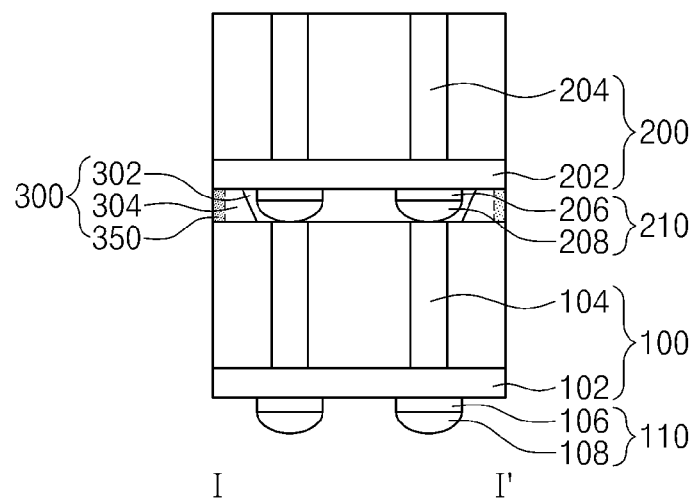

FIG. 1 is a top plan view of an exemplary embodiment of a semiconductor package in accordance with principles of inventive concepts, and FIGS. 2 to 4 are cross-sectional views of exemplary embodiments of semiconductor packages in accordance with principles of inventive concepts. FIGS. 2 to 4 are cross-sectional views taken along the line I-I' in FIG. 1.

In accordance with principles of inventive concepts, a semiconductor package may include a plurality of semiconductor elements that are vertically stacked. Such a stack may include two or more semiconductor elements, for example.

Referring to FIGS. 1 to 4, an exemplary semiconductor package in accordance with principles of inventive concepts may include a first semiconductor element 100, a first connection structure 110, a second connection structure 210, and a protective structure 300.

The first semiconductor element 100 may include a substrate 102, a semiconductor chip (not shown), and a penetration electrode 104. The substrate 102 may be a semiconductor substrate containing silicon and/or germanium, for example. The semiconductor chip may be disposed on the substrate 102. The semiconductor chip may be a memory chip or a logic chip, for example. The penetration electrode 104 may be disposed to penetrate the first semiconductor element 100.

The first connection structure 110 may be disposed on one surface of the first semiconductor element 100, which may be referred to herein as the bottom surface of the first semiconductor element 100. In an exemplary embodiment in accordance with principles of inventive concepts, the first connection structure 110 may be provided in plurality. The plurality of first connection structures 110 may be collectively disposed in one region of the first, or bottom, surface of the first semiconductor element 100. In addition, the first connection structure 110 may be electrically connected to the first semiconductor element 100. For example, the first connection structure 110 may include a connection pad 106 and a solder ball 108.

In an exemplary embodiment in accordance with principles of inventive concepts, a second semiconductor element 200 may be disposed to be oppositely, or opposingly, spaced apart from a second surface (also referred to herein as top surface) of the first semiconductor element 100. The second surface of the first semiconductor element 100 may be opposite to the first surface thereof.

The second semiconductor element 200 may include a substrate 202, a semiconductor chip (not shown), and a penetration electrode 204. In an exemplary embodiment in accordance with principles of inventive concepts, components of the second semiconductor device 200 are substantially identical to those of the first semiconductor element 100 and will not be described in further detail here.

A second connection structure 210 may be disposed on a first surface (also referred to herein as a bottom surface) of the second semiconductor element 200. As illustrated in FIG. 1, the second connection structure 210 may be provided in plurality. The plurality of second connection structures 210 may be collectively disposed in one region AR of the first surface of the second semiconductor element 200. In addition, the second connection structure 210 may electrically connect the first and second connection structures 110 and 210 with each other. In an exemplary embodiment in accordance with principles of inventive concepts, the second connection structure 210 may include a connection pad 206 and a solder ball 208.

In an exemplary embodiment in accordance with principles of inventive concepts, a protective structure 300 may be disposed between the first and second semiconductor elements 100 and 200 to protect the second connection structure 210 and provide bonding and insulation between the first and second semiconductor elements 100 and 200.

In an exemplary embodiment in accordance with principles of inventive concepts, the protective structure 300 may include a first material layer 302 and a second material layer 304. In FIG. 1, when viewed from the top, the first material layer 302 may fully cover the respective second connection structures 210. More specifically, the first material layer 302 may fully cover side surfaces of the respective second connection structures 210. Upper and lower portions of the respective second connection structures 210 may be electrically connected to the first and second semiconductor elements 100 and 200, respectively. In accordance with principles of inventive concepts, the first material layer 302 may have a smaller area than the first surface of the second semiconductor element 200, for example. In addition, the first material layer 302 may have substantially the same, or larger, area as the one region AR of the first surface of the second semiconductor element 200.

In FIGS. 2 to 4, when viewed cross-sectionally, the first material layer 302 may fully fill a space between adjacent second connection structures 210 and extend to the outside of the adjacent second connection structure 210. In accordance with principles of inventive concepts, the first material layer 302 may have a sloped side surface that narrows in a direction of the first semiconductor element 100.

The second material layer 304 may be disposed adjacent to the first material layer 302, for example. In an exemplary embodiment in accordance with principles of inventive concepts, the second material layer 304 is not in contact with the second connection structure 210. In FIG. 1, when viewed from the top, one can see an exemplary embodiment in accordance with principles of inventive concepts in which the second material layer 304 may be disposed in a region, in which the first material layer 302 is not disposed, of one surface of the second semiconductor element 200. The second material layer 304 may be disposed to cover (that is, surround and retain) the first material layer 302. In FIGS. 2 to 4, when viewed cross-sectionally, a side surface of the second material layer 304 may substantially the same plane as the side surfaces of the first and second semiconductor elements 100 and 200.

In an exemplary embodiment in accordance with principles of inventive concepts, the first material layer 302 may include an adhesive film and the second material layer 304 may include an insulating material (insulating structure). In accordance with principles of inventive concepts, the first material layer 302 may include epoxy and a silicon filler and may further include an adhesive material.

According to an exemplary embodiment in accordance with principles of inventive concepts, as illustrated in FIG. 2, the second material layer 304 may include an underfill material. The underfill material may include epoxy and a silicon filler. According to another embodiment in accordance with principles of inventive concepts, as illustrated in FIG. 3, the second material 350 may include a molding material. The molding material may include silicon and a silicon filler, for example. Alternatively, the molding material may include epoxy and a silicon filler. According to another embodiment in accordance with principles of inventive concepts, as illustrated in FIG. 4, the second material layer 350 may include an underfill material 304 and a molding material 350. The underfill material 304 may be disposed to cover the first material layer 302, and the molding material 350 may be disposed to cover the underfill material 304, for example.

As an adhesive film, the first material layer 302 of the protective structure 300 may be disposed to cover the side surface of the connection structure 210 with a smaller area than the first and second semiconductor elements 100 and 200, for example. Accordingly, the first material layer 302 may be prevented from flowing out to the side surfaces of the first and second semiconductor devices 100 and 200 by an external pressure. As a result, in accordance with principles of inventive concepts a void may be prevented from being formed in a molding structure (350 in FIG. 5D) by the outflow of the first material layer 302. Moreover, a space between the first and second semiconductor elements 100 and 200 is filled with an underfill material or a molding material to provide protection and insulation between the first and second semiconductor elements 100 and 200.

FIG. 2 and FIGS. 5A through 5E are cross-sectional views illustrating a method for manufacturing a semiconductor package according to an exemplary embodiment in accordance with principles of inventive concepts.

Referring to FIG. 5A, a plurality of first semiconductor elements 100 may be formed on a substrate. First connection structures 110 may be formed on a first surface of the substrate.

A first material layer 302 may be formed at each second semiconductor element 200 where a second connection structure 210 is formed. Each second connection structure 210 may be disposed in one region AR of a first surface of each second semiconductor device 200. The first material layer 302 may have a larger area than the one region AR. In addition, the first material layer 302 may have a smaller area than a first surface of the second semiconductor element 200. The first material layer 302 may employ an adhesive film.

The second connection structures 210 may be disposed on second surfaces of the first semiconductor elements 100 to face each other. The second surface of the first semiconductor element 100 may correspond to the first surface of the second semiconductor element 200. The second semiconductor elements 200 may be arranged to correspond to the first semiconductor elements 100, respectively.

Figure 5B:
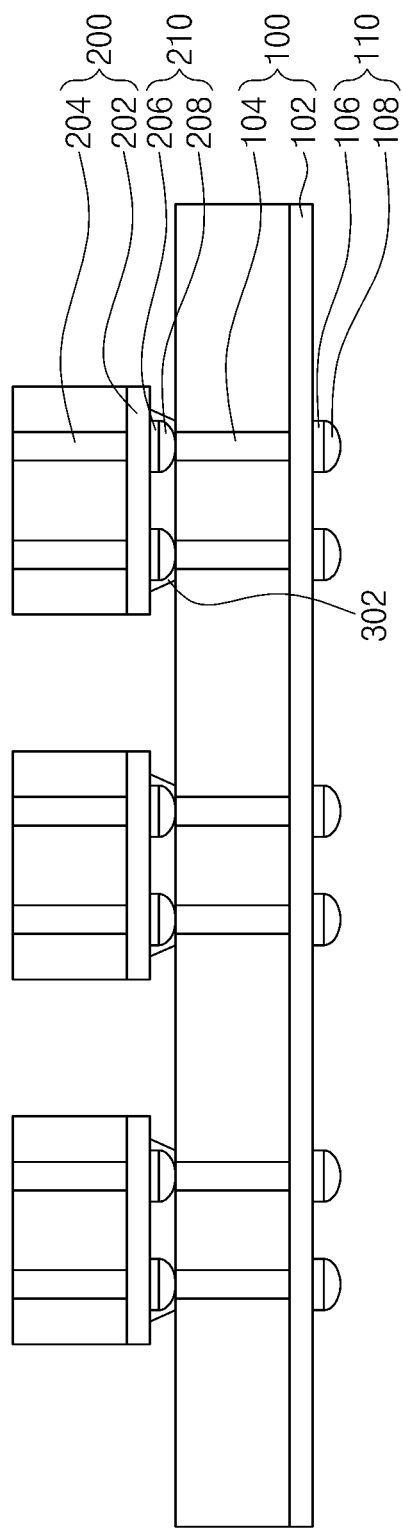

Referring to FIG. 5B, by pressurizing each of the second semiconductor elements 200 to the second surface of the first semiconductor element 100, the first and second elements 100 and 200 may be electrically connected by the second connection structures 210, respectively.

In exemplary embodiments in accordance with principles of inventive concepts, each of the second connection structures 210 may include a connection pad 206 and a solder ball 208. The solder ball 208 may have a hemispherical shape and extend through the first material layer 302 during pressurization of the second semiconductor elements 200. Thus, the first and second semiconductor elements 100 and 200 may be electrically connected by the solder ball 208 of the second connection structure 210. Besides a portion of the hemispherical solder ball 208 extending beyond first material layer 302, the second connection structure 210 may remain protected by the first material layer 302.

In some exemplary embodiments in accordance with principles of inventive concepts, the first material layer 302 may have a larger area than one region AR of the first surface of the second semiconductor element 200 and a smaller area than the whole area of the first surface of the second semiconductor element 200. Thus, the first material layer 302 may be prevented from extruding to the side surfaces of the first and second semiconductor elements 100 and 200 during the pressurization process. As a result, a void may be prevented from being formed by extruded first material layer 302 during subsequent formation of a molding structure (350 in FIG. 5D).

Figure 5C:
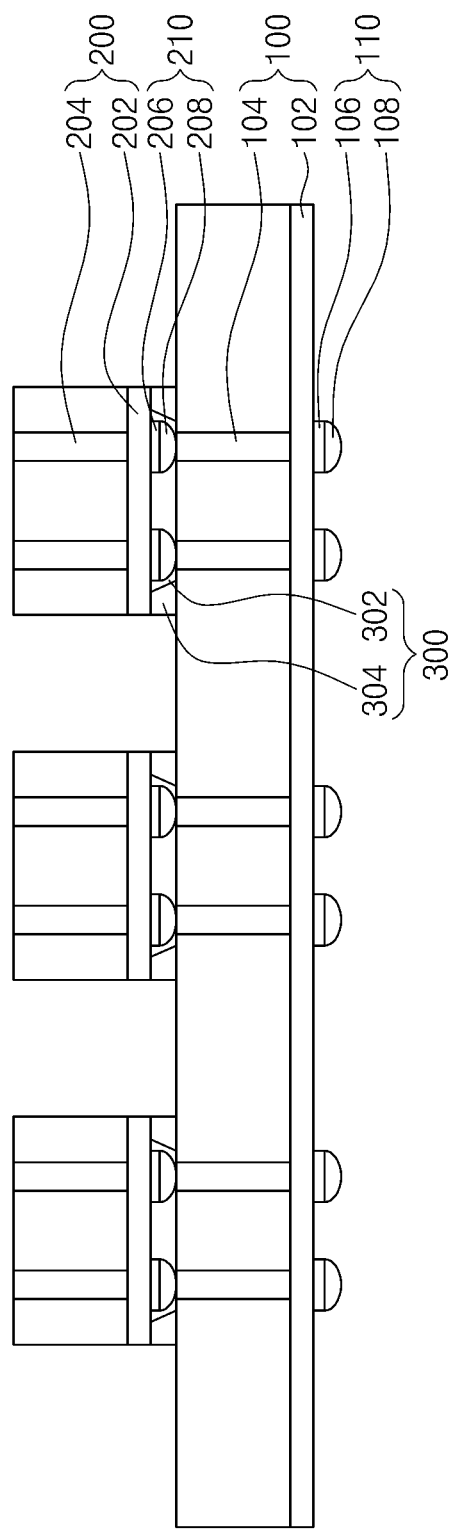

Referring to FIG. 5C, a second material layer 304 may be injected between the first and second semiconductor elements 100 and 200 to form a protective structure 300 including the first and second material layers 302 and 304.

The second material layer 304 may be formed to fully fill a space between the first and second semiconductor elements 100 and 200 and to cover the first material layer 302. In some exemplary embodiments in accordance with principles of inventive concepts, the second material layer 304 may include an underfill material.

Figure 5D:
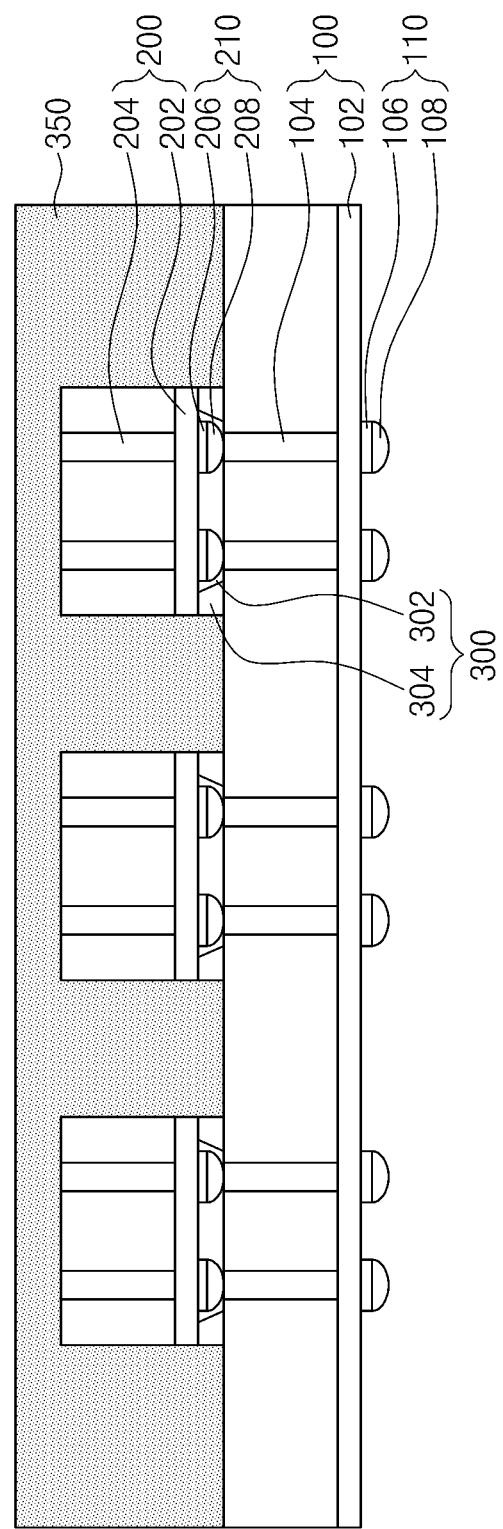

Referring to FIG. 5D, a molding structure 350 may be formed to cover the first and second semiconductor elements 100 and 300.

Figure 5E:
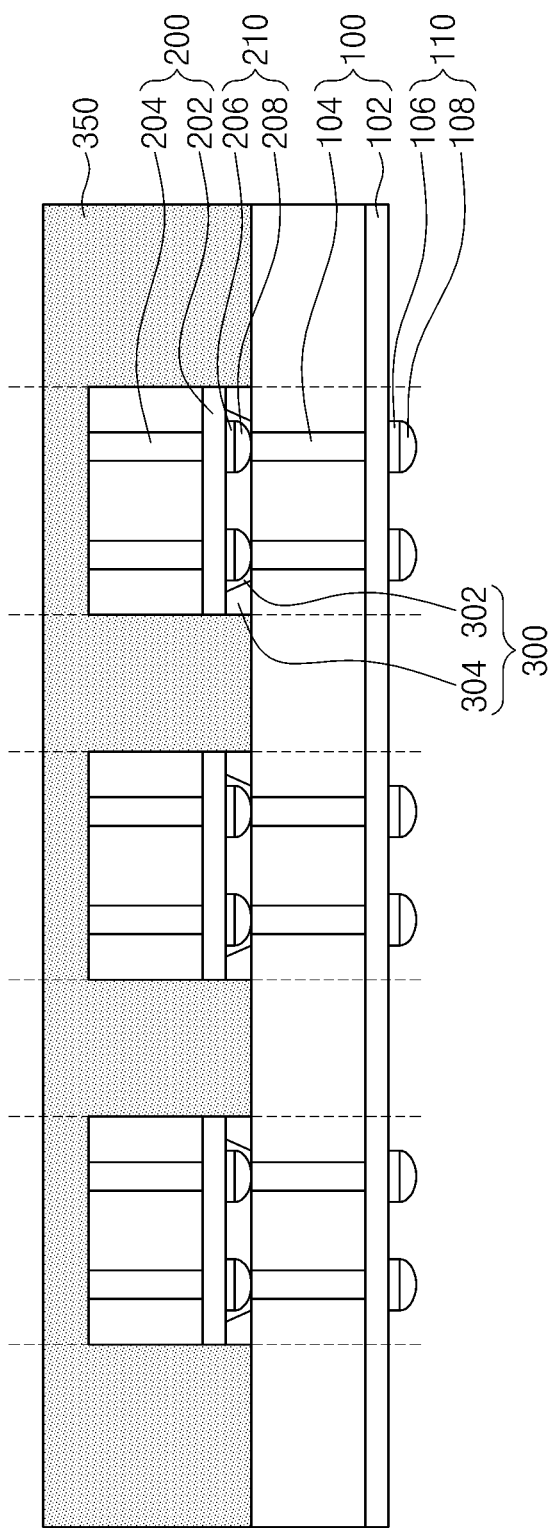

Referring to FIGS. 5E and 2, the molding structure 350 and the first and second semiconductor elements 100 and 200 may be cut, or divided, to complete manufacturing of a vertically stacked semiconductor package in accordance with principles of inventive concepts.

Figure 6:
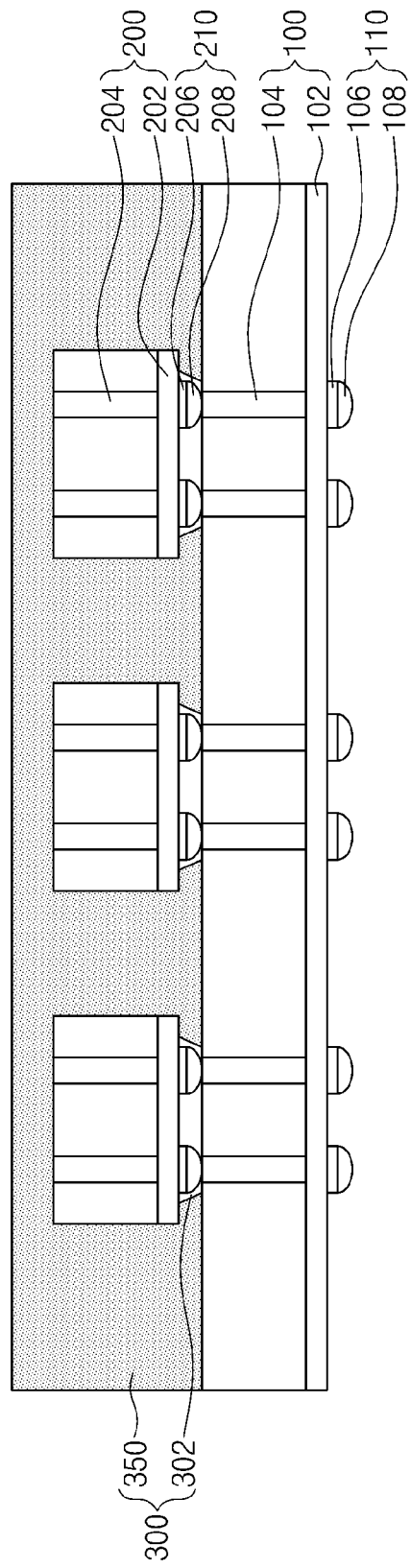
FIG. 6 is a cross-sectional view illustrating an exemplary embodiment of a method for manufacturing a semiconductor package according to another embodiment in accordance with principles of inventive concepts.

FIGS. 3 and 6 are cross-sectional views illustrating a method for manufacturing a semiconductor package according to another exemplary embodiment in accordance with principles of inventive concepts.

Referring to FIG. 6, a plurality of unseparated first semiconductor elements 100 and first connection structures 110 may be formed on a substrate 102, and second semiconductor elements 200 separated and electrically connected by the second connection structure 210 may be formed on the first semiconductor elements 100. A first material layer 302 may be formed adjacent to the second connection structure 210. This process is substantially identical to that described in the discussion related to FIGS. 5A and 5B and the detailed description will not be repeated here.

A molding structure 350 may be formed to cover the first and second semiconductor elements 100 and 200. In some exemplary embodiments in accordance with the principles of inventive concepts, the molding structure 350 may function as a second material layer 350 covering the first material layer 302 and filling a space between the first and second semiconductor elements 100 and 200. Thus, a protective structure 300 may be formed which includes the first material layer 302 and the second material layer to which the molding structure 350 is applied.

Returning to FIG. 3, the molding structure 350 and the first and second semiconductor elements 100 and 200 may be cut, or divided, to complete manufacturing of a vertically stacked semiconductor package in accordance with principles of inventive concepts.

Figure 7A:
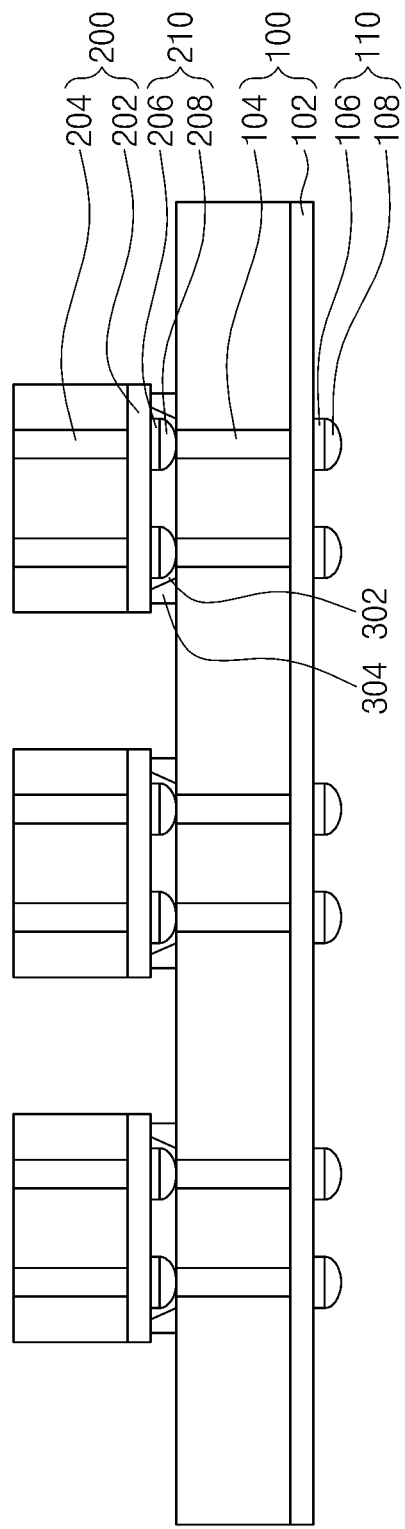
FIGS. 7A and 7B are cross-sectional views illustrating an exemplary embodiment of a method for manufacturing a semiconductor package according to another embodiment in accordance with principles of inventive concepts.
Figure 7B:
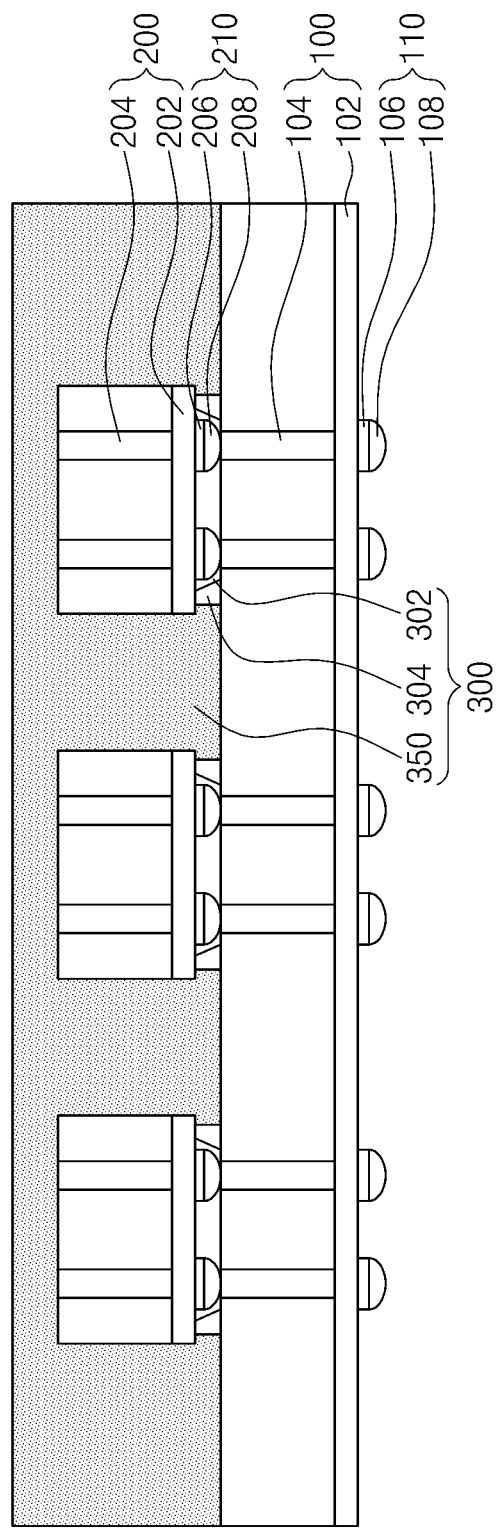

FIG. 4 and FIGS. 7A and 7B are cross-sectional views illustrating a method for manufacturing a semiconductor package according to another exemplary embodiment in accordance with principles of inventive concepts.

Referring to FIG. 7A, a plurality of unseparated first semiconductor elements 100 and first connection structures 110 may be formed on a substrate 102, and second semiconductor elements 200 separated and electrically connected by the second connection structure 210 may be formed on the first semiconductor elements 100. A first material layer 302 may be formed adjacent to the second connection structure 210. This process is substantially identical to the process described in the discussion related to FIGS. 5A and 5B and a detailed description of the process will not be repeated here.

A second material layer 304 may be injected between the first and second semiconductor elements 100 and 200. The second material layer 304 may be formed to fill a space between the first and second semiconductor elements 100 and 200 and to cover the first material layer 302. In some exemplary embodiments in accordance with principles of inventive concepts, the second material layer 304 may include an underfill material.

Referring to FIG. 7B, a molding structure 350 may be formed to cover the first and second semiconductor elements 100 and 200. In some exemplary embodiments in accordance with principles of inventive concepts, the molding structure 350 may fully fill a space between the first and second semiconductor elements 100 and 200. Thus, the second material layer may include an underfill material 304 and a molding material 350. As a result, a protective structure 300 may be formed which includes the first material layer 302 and the second material layer including the underfill material 304 and the molding material 350.

Returning to FIG. 4, the molding structure 350 and the first and second semiconductor elements 100 and 200 may be cut, or divided, to complete manufacturing of a vertically stacked semiconductor package in accordance with principles of inventive concepts.

Figure 8A:
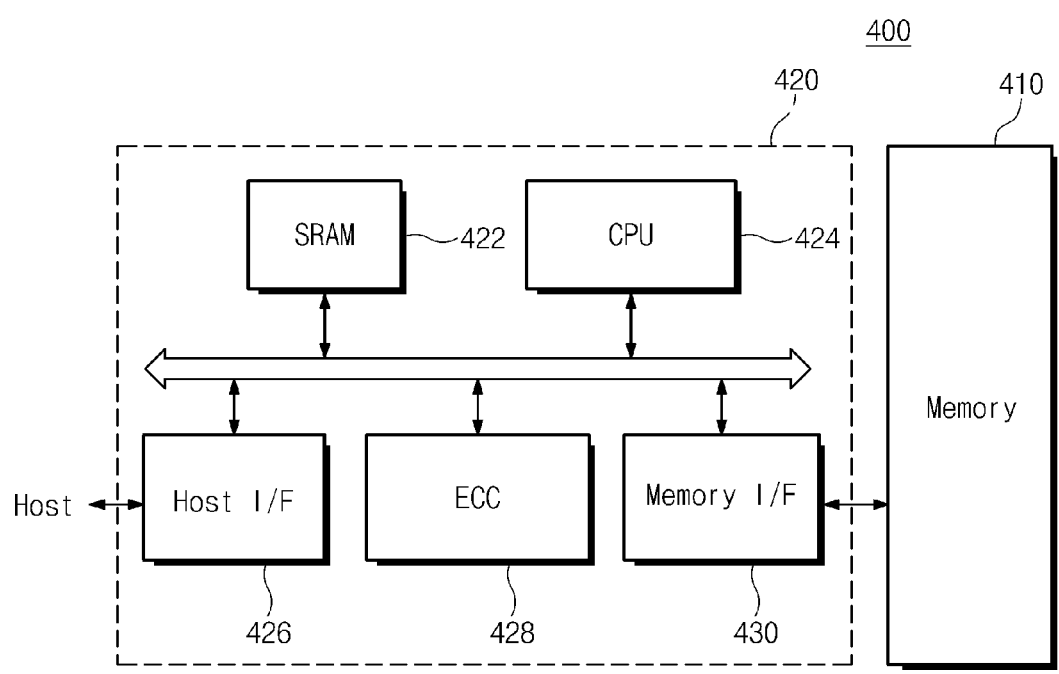
FIG. 8A is a block diagram of an exemplary embodiment of a memory card to which a memory device in accordance with principles of inventive concepts is applied.

FIG. 8A is a block diagram of a memory card to which a memory device according to an embodiment of the inventive concept is applied. That is, a memory card 400 may employ a vertically stacked semiconductor package in accordance with principles of inventive concepts.

Referring to FIG. 8A, a semiconductor package in accordance with principles of inventive concepts may be applied to a memory card 400. For example, the memory card 400 may includes a memory controller 420 that controls data exchange between a host and a memory 410. An SRAM 422 may be used as a working memory of a central processing unit (CPU) 424. A host interface 426 may have data exchange protocol of a host connected to the memory card 400. An error correction code (ECC) 428 may detect and correct an error included in data read from the memory 410. A memory interface 430 interfaces with the memory 410. The CPU 424 performs an overall control operation for data exchange of the memory controller 420.

In an exemplary embodiment in accordance with principles of inventive concepts, semiconductor memory 410 applied to the memory card 400 includes a vertically stacked semiconductor package according to an exemplary embodiment in accordance with principles of inventive concepts and, as a result, formation of a void in a molding structure may be suppressed, or avoided. By thus avoiding the formation of a void in a molding structure, the reliability of the semiconductor memory 410 including the semiconductor package may be improved.

Figure 8B:
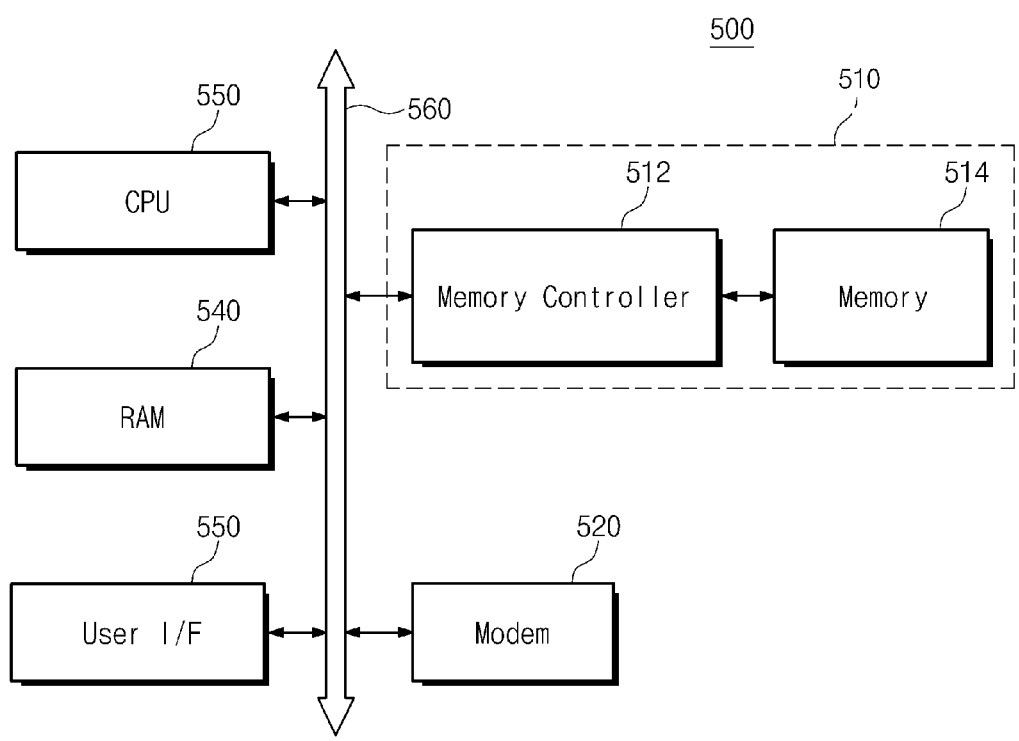
FIG. 8B is a block diagram of an exemplary embodiment of a system including a memory device in accordance with principles of inventive concepts.

FIG. 8B is a block diagram of an information processing system employing a memory device in accordance with principles of inventive concepts.

Referring to FIG. 8B, an information processing system 500 may include a semiconductor memory device in accordance with principles of inventive concepts. The information processing system 500 may include a mobile device or a computer, for example. In an exemplary embodiment in accordance with principles of inventive concepts, the information processing system 500 may include a memory system 510 and a modem 520, a central processing unit (CPU) 530, a random access memory (RAM) 540, and a user interface 550 which are electrically connected to a system bus 560. Data processed by the CPU 530 or externally input data may be stored in the memory system 510. The memory system 510 may include a memory 512 and a memory controller 514 and may be configured with the substantially same structure as the memory card 400 in accordance with principles of inventive concepts described in the discussion related to FIG. 8A. The information processing system 500 may be provided to a memory card, a solid state disk (SSD), a camera image sensor (CIS), a mobile device, or other application chipsets, for example. In an exemplary embodiment, the memory system 510 may be configured with a solid state disk (SSD). In such an embodiment, the information processing system 500 can stably and reliably store high-capacity data in the memory system 510.

As previously described, a plurality of semiconductor elements, each of which may include a semiconductor chip and a substrate, for example, may be vertically stacked to form a vertically stacked semiconductor package that provides a high level of functional density. A connection structure may be formed between any pair of semiconductor elements in the stack of semiconductor elements. Connection structure(s) may occupy a region AR that does not extend to the edges of the semiconductor elements. That is, a perimeter area of each of the joined semiconductor elements may surround the connection structure regions AR. The connection structure may include connection pads and solder balls, for example. A protection structure, including first and second material layers, may be formed between the first and second joined semiconductor elements. A first material layer may encompass the connection structure and may be adjacent to and in contact with the connection structure. The first material layer, which may include an adhesive film, may adhere to and join a plurality of semiconductor elements, for example, surrounding a connection structure that electrically interconnects the semiconductor chips and circuitry contained therein. The first material layer may extend only a perimeter that surrounds the connection region AR. The second material layer, which may include insulating material, may retain the first material layer in a position between the joined semiconductor chips, within the perimeter, preventing it from flowing beyond the edges of the joined semiconductor elements, particularly during a manufacturing process which may include a step where the semiconductor elements are placed under pressure. In exemplary embodiments in accordance with principles of inventive concepts, the first layer does not extend to the edges of the joined semiconductor elements and the second layer surrounds the first layer, extending from chip-to-chip and retaining the first layer therebetween. The first and second layers may have sloped mating walls, for example. In this manner, the first material layer can be prevented from extruding to side surfaces of semiconductor elements and, during subsequent formation of a molding structure, a void can thereby be prevented from being formed in the molding structure by an extruding first material layer. That is, in accordance with principles of inventive concepts, the second material layer operate as a retention barrier for the first material layer. By such avoidance or elimination of a void, the reliability of a semiconductor package can be enhanced.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor package comprising:
   a first semiconductor element;
   a second semiconductor element opposingly spaced apart from the first semiconductor element;
   a connection structure disposed between the semiconductor elements to electrically connect the first and second semiconductor elements to each other; and
   a protective structure disposed to protect the connection structures and bond the first and second semiconductor elements to each other,
   wherein the protective structure comprises:
   a first material layer disposed to fully cover the connection structures; and
   a second material layer disposed to surround the first material layer, wherein a side surface of the second material layer is in the same plane as side surfaces of the first and second semiconductor elements.

2. The semiconductor package as set forth in claim 1, wherein the connection structure is part of a plurality of connection structures, and the plurality of connection structures are collectively disposed, on one region of one surface of the second semiconductor element.

3. The semiconductor package as set forth in claim 2, wherein the first material layer has the substantially same or larger area as the one region of the second semiconductor element.

4. The semiconductor package as set forth in claim 3, wherein the second material layer covers a region of the one surface of the second semiconductor element where the first material layer is not disposed.

5. The semiconductor package as set forth in claim 1, wherein the connection structure is part of a plurality of connection structures, and the first material layer fully fills a space between adjacent connection structures, when viewed cross-sectionally, extends to an outside of the adjacent connection structures, and has a sloped mating surface with the second material layer.

6. The semiconductor package as set forth in claim 1, wherein the first material layer includes an adhesive film.

7. The semiconductor package as set forth in claim 1, wherein the second material layer is not in contact with the connection structure.

8. The semiconductor package as set forth in claim 1, wherein the second material layer includes an underfill material or a molding material.

9. The semiconductor package as set forth in claim 1, wherein each of the first and second semiconductor elements includes penetration electrodes penetrating the first and second semiconductor elements.

* * * * *